US012596158B2

(12) United States Patent (10) Patent No.: US 12,596,158 B2
Suzuki (45) Date of Patent: Apr. 7, 2026

(54) DIAGNOSTIC DEVICE FOR POWER SUPPLY DEVICE FOR ELECTRIC DISCHARGE MACHINE

(71) Applicant: MAKINO MILLING MACHINE CO., LTD., Tokyo (JP)

(72) Inventor: Katsutomo Suzuki, Kanagawa (JP)

(73) Assignee: MAKINO MILLING MACHINE CO., LTD., Tokyo (JP)

( * ) Notice: Subject to any disclaimer, the term of this patent is extended or adjusted under 35 U.S.C. 154(b) by 176 days.

(21) Appl. No.: 18/701,118

(22) PCT Filed: Oct. 3, 2022

(86) PCT No.: PCT/JP2022/036998
§ 371 (c)(1),
(2) Date: Apr. 12, 2024

(87) PCT Pub. No.: WO2023/063152
PCT Pub. Date: Apr. 20, 2023

(65) Prior Publication Data
US 2024/0353501 A1 Oct. 24, 2024

(30) Foreign Application Priority Data
Oct. 15, 2021 (JP) ................................. 2021-169869

(51) Int. Cl.
*G01R 31/40* (2020.01)
*B23H 7/14* (2006.01)

(52) U.S. Cl.
CPC ................ *G01R 31/40* (2013.01); *B23H 7/14* (2013.01)

(58) Field of Classification Search
CPC .......... G01R 31/40; B23H 7/14; B23H 9/006; B23H 9/14; B23H 1/024; B23H 7/20; B23H 1/02; B23H 7/16
(Continued)

(56) References Cited

U.S. PATENT DOCUMENTS

| | | | | | |
|---|---|---|---|---|---|
| 5,903,067 A | * | 5/1999 | Sato | ........................ | B23H 1/022 |
| | | | | | 307/115 |
| 2015/0360310 A1 | * | 12/2015 | Tee | ........................ | B23H 1/022 |
| | | | | | 219/69.16 |
| 2018/0015557 A1 | * | 1/2018 | Nakashima | ............ | B23H 11/00 |

FOREIGN PATENT DOCUMENTS

| | | | |
|---|---|---|---|
| JP | S61-293717 A | 12/1986 | |
| JP | H7-1238 A | 1/1995 | |

(Continued)

OTHER PUBLICATIONS

International Search Report for PCT/JP2022/036998 (Nov. 8, 2022).

*Primary Examiner* — Giovanni Astacio-Oquendo

(74) *Attorney, Agent, or Firm* — Merchant & Gould P.C.

(57) ABSTRACT

A simulated current generation unit is connected in series to a power supply device for an electric discharge machine in a state in which a contact and a contact are in contact with each other and generates a simulated current ($I_{sim}$) for simulating current caused by dielectric breakdown of a discharge gap constituted by a workpiece and a pipe electrode, which face each other with a predetermined gap in order to perform electrical discharge machining of the workpiece by a narrow-hole electric discharge machine, based on an applied voltage of the power supply device for an electric discharge machine. An NC device judges the presence or absence of an abnormality of the power supply device for an electric discharge machine based on the simulated current ($I_{sim}$) detected by a current detection unit.

9 Claims, 6 Drawing Sheets

(58) Field of Classification Search
      USPC ................................... 324/764.01, 537, 500
      See application file for complete search history.

(56)                     References Cited

FOREIGN PATENT DOCUMENTS

| | | |
|---|---|---|
| JP | H10-97312 A | 4/1998 |
| JP | 2018-8355 A | 1/2018 |
| WO | 2023/063152 A1 | 4/2023 |

* cited by examiner

DIAGNOSTIC DEVICE FOR POWER SUPPLY DEVICE FOR ELECTRIC DISCHARGE MACHINE

This application is a National Stage Application of PCT/JP2022/036998, filed Oct. 3, 2022, which claims benefit of priority to Japanese Patent Application No. 2021-169869 filed on Oct. 15, 2021, and which applications are incorporated herein by reference. To the extent appropriate, a claim of priority is made to each of the above disclosed applications.

FIELD

The present invention relates to a diagnostic device for a power supply device for an electric discharge machine.

BACKGROUND

In order to perform electrical discharge machining (narrow-hole electrical discharge machining, die-sinking electrical discharge machining, etc.) on a workpiece using an electric discharge machine, a power supply device for an electric discharge machine which applies a pulsed voltage to a discharge gap constituted by a workpiece and an electrode which face each other with a predetermined gap is used. Such a power supply device for an electric discharge machine comprises a DC power supply which is connected in series to the discharge gap to apply voltage for generating current to the discharge gap, and a switching element which is arranged between the discharge gap and the DC power supply, and a cable is interposed between the discharge gap and the switching element.

Conventionally, electric discharge machines which detect the discharge voltage, discharge current, or impedance level in the discharge gap during machining of a workpiece, and which judge that an abnormal discharge has occurred when the detected level of discharge voltage, discharge current, or impedance does not meet a predetermined condition have been proposed (for example, Patent Literature 1). In such an electric discharge machine, normal discharge is generated after eliminating abnormal discharge in order to avoid the occurrence of defective products.

CITATION LIST

Patent Literature

PTL [1] Japanese Unexamined Patent Publication (Kokai) No. 61-293717

SUMMARY

Technical Problem

However, in conventional electric discharge machines, if there is an abnormality such as a failure in the power supply device for the electric discharge machine, normal discharge cannot be generated after eliminating the abnormal discharge that occurs during machining of the workpiece. If a workpiece is subjected to electrical discharge machining using an electric discharge machine that uses a power supply device for an electric discharge machine that has an abnormality, it is impossible to avoid the occurrence of defective products.

An object of the present invention is to provide a diagnostic device for a power supply device for an electric discharge machine which can diagnose the presence or absence of an abnormality in the power supply device for an electric discharge machine prior to electric discharge machining of a workpiece by the electric discharge machine.

Solution to Problem

The diagnostic device for a power supply device for an electric discharge machine according to the present invention is a diagnostic device for a power supply device for an electric discharge machine which applies a pulsed voltage to a discharge gap constituted by a workpiece and an electrode which face each other with a predetermined gap in order to perform electrical discharge machining on the workpiece with the electric discharge machine, the diagnostic device comprising a first contact which is capable of establishing conduction with one side of a power supply device for an electric discharge machine via a conductive part of the electric discharge machine, a second contact which is capable of establishing conduction with the other side of the power supply device for an electric discharge machine via a conductive part of a table on which the workpiece is arrange, and which can be brought into contact with or separated from the first contact, a simulated current generation unit which is connected in series to the power supply device for an electric discharge machine in a state in which the first contact and the second contact are in contact with each other and which generates a simulated current for simulating current caused by dielectric breakdown of the discharge gap based on the applied voltage of the power supply device for an electric discharge machine, and a judgment unit which detects the simulated current and judges the presence or absence of an abnormality in the power supply device for an electric discharge machine based on the simulated current.

According to the present invention, the simulated current generation unit, which is connected in series to the power supply device for an electric discharge machine in a state in which the first contact and the second contact are in contact, generates the simulated current for simulating the current which occurs due to dielectric breakdown of the discharge gap based on an applied voltage of the power supply device for an electric discharge machine. Furthermore, the judgment unit detects the simulated current and judges the presence or absence of an abnormality of the power supply device for an electric discharge machine based on the simulated current. Since the presence or absence of an abnormality of the power supply device for an electric discharge machine is judged based on the simulated current which occurs due to dielectric breakdown of the discharge gap, the presence or absence of an abnormality of the power supply device for an electric discharge machine can be diagnosed before electrical discharge machining of a workpiece by the electric discharge machine.

Furthermore, according to the present invention, by diagnosing the presence or absence of an abnormality of the power supply device for an electric discharge machine before electric discharge machining of a workpiece by the electric discharge machine, if there is an abnormality in the power supply device for an electric discharge machine, the malfunctioning part of the power supply device for an electric discharge machine can be repaired, the power supply device for an electric discharge machine can be replaced, etc. Since the power supply device for an electric discharge machine can be made normal by repairing the malfunctioning part of the power supply device for an electric discharge machine, replacing the power supply device for an electric discharge machine. etc., it is possible to avoid producing defective products due to electrical discharge machining of a workpiece by an electric discharge machine using a power supply device for an electric discharge machine that has an abnormality.

Further, according to the present invention, it is possible to avoid producing defective products due to electrical discharge machining of a workpiece by an electric discharge machine using a power supply device for an electric discharge machine that has an abnormality. Thus, there is no need to interrupt machining of workpieces for inspection when a defective product is produced by electrical discharge machining of a workpiece by an electric discharge machine using a power supply device for an electric discharge machine having an abnormality nor to dispose of defective products. Furthermore. it is possible to avoid wear and tear on the electrodes when a defective product is produced by electrical discharge machining of a workpiece by an electric discharge machine using a power supply device for an electric discharge machine having an abnormality.

It is preferable that the judgment unit judges the presence or absence of an abnormality of the power supply device for an electric discharge machine based on at least one of an average current of the simulated current and an on-time and off-time of the simulated current. By judging the presence or absence of an abnormality of the power supply device for an electric discharge machine based on at least one of an average current of the simulated current and an on-time and off-time of the simulated current, it is possible to accurately diagnose the presence or absence of an abnormality of the power supply device for an electric discharge machine before electrical discharge machining of the workpiece by the electric discharge machine.

It is preferable that the judgment unit, prior to generating the simulated current, detects a simulated voltage which simulates voltage before dielectric breakdown of the discharge gap generated by the power supply device for an electric discharge machine in a state in which the first contact and the second contact are in contact or in a state in which the first contact and the second contact are not in contact, and judges the presence or absence of abnormality of the power supply device for an electric discharge machine based on the simulated voltage. As a result, the presence or absence of an abnormality of the power supply device for an electric discharge machine can be diagnosed before generating the simulated current.

It is preferable that the judgment unit judges the presence or absence of an abnormality of the power supply device for an electric discharge machine based on at least one of a peak voltage of the simulated voltage and a rise time of the simulated voltage. By judging the presence or absence of an abnormality of the power supply device for an electric discharge machine based on at least one of a peak voltage of the simulated voltage and a rise time of the simulated voltage, it is possible to accurately diagnose the presence or absence of an abnormality of the power supply device for an electric discharge machine before generating the simulated current.

It is preferable that the simulated current generation unit comprises a resistor which is connected in series to the power supply device for an electric discharge machine, and the resistor has a resistance value corresponding to a resistance value of the discharge gap when the dielectric breakdown occurs. By using such a resistor, the simulated current can accurately simulate the current caused by dielectric breakdown of the discharge gap.

It is preferable that the simulated current generation unit further comprises a switching element which is connected in series to the resistor, and the switching element is opened by an NC device of the electric discharge machine during generation of the simulated voltage, and is closed by the NC device of the electric discharge machine during generation of the simulated current. By using such a switching element, the simulated voltage and simulated current can quickly be generated.

It is preferable that the switching element is a contactor switch. By using a contactor switch as the switching element, it is possible to reduce variations in judgment of the presence or absence of an abnormality of the power supply device for an electric discharge machine.

It is preferable that the judgment unit judges the presence or absence of a contact failure between the first contact and the second contact. By determining the presence or absence of a contact failure between the first contact and the second contact in this manner, if there is a contact failure between the first contact and the second contact, the location of the contact failure between the first contact and the second contact can be repaired.

It is preferable that the judgment unit judges the presence or absence of a malfunction of the switching element. By judging the presence or absence of a malfunction of the switching element in this manner, if there is a malfunction of the switching element, the switching element can be exchanged.

DESCRIPTION OF EMBODIMENTS

The embodiments of the diagnostic device for a power supply device for an electric discharge machine according to the present invention will be described in detail with reference to the drawings.

Figure 1:
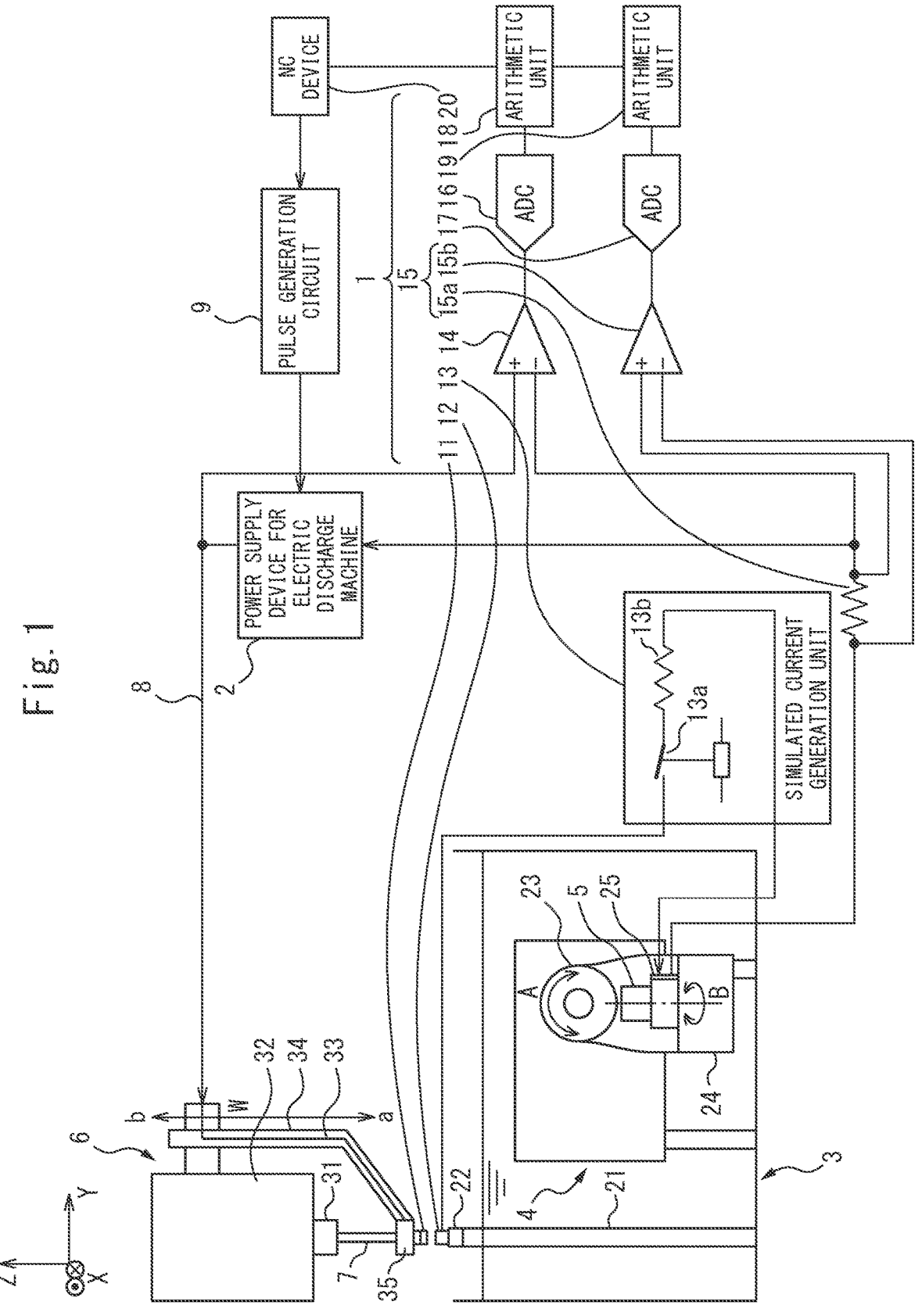
FIG. 1 is a view showing a system comprising a diagnostic device for a power supply device for an electric discharge machine according to an embodiment of the present invention.

FIG. 1 is a view showing a system comprising a diagnostic device for a power supply device for an electric discharge machine according to an embodiment of the present invention. In FIG. 1, a diagnostic device I diagnoses the presence or absence of an abnormality of a power supply device 2 for an electric discharge machine. Specifically, the diagnostic device I judges the presence or absence of an abnormality of the power supply device 2 for the electric discharge machine, and if there is an abnormality, generates and displays an alarm indicating that there is an abnormality in the power supply device 2 for an electric discharge machine. The diagnostic device I is an example of the diagnostic device for a power supply device for an electric discharge machine.

The power supply device 2 for an electric discharge machine performs electric discharge machining on a workpiece 5 arranged on a table 4 immersed in electric discharge liquid in a work tank 3 using a narrow-hole electric discharge machine 6. Thus, the power supply device 2 for an electric discharge machine applies, via a cable 8, a pulsed voltage to a discharge gap, which is constituted by a workpiece 5 and a pipe electrode 7 which face each other with a predetermined gap. The narrow-hole electric discharge machine 6 is an example of the electric discharge machine. The pipe electrode 7 is an example of an electrode.

The power supply device 2 for the electric discharge machine includes a DC power source (not illustrated) and a switching element (not illustrated) such as an NMOS transistor. A pulse signal generated by a pulse signal generation circuit 9 based on machining condition settings for the workpiece 5 (in this case, narrow-hole electrical discharge machining) and pulse generation conditions corresponding to diagnostic conditions, etc., which will be described later, is input to the switching element of the power supply device 2 for an electric discharge machine. The switching element of the power supply device 2 for an electric discharge machine controls power supply to the narrow-hole electric discharge machine 6 by the DC power supply of the power supply device 2 for an electric discharge machine in accordance with the pulse signal. The machining condition settings for the workpiece 5 are determined in relation to the material of the workpiece 5, the material of the pipe electrode 7, the machining shape of the workpiece 5, etc. The pulse generation conditions include the pulse on/off time of the pulse train, the number of pulses of the pulse train, the pulse pause time, etc.

In addition to the table 4, a stand 21 is arranged in the work tank 3. An insulating part 22 is provided at the upper end of the stand 21. The table 4 has an inclined table 23 which can support the workpiece 5 so as to be capable of rotating along arrow A, a rotating table 24 which supports the workpiece 5 so as to be capable of rotating along arrow B, and a conductive part 25 which is composed of a conductive material and provided on the rotating table 24.

The narrow-hole electric discharge machine 6 is provided for electrical discharge machining of the workpiece 5. The narrow-hole electric discharge machine 6 comprises a spindle device 32 to which an electrode holder 31 is attached, a guide arm 34 having a built-in power supply line 33, and a power supply base 35 which is electrically connected to the power supply line 33 by being attached to a distal end of the guide arm 34 to directly connect and supply power to the pipe electrode 7. The electrode holder 31 holds the pipe electrode 7. Furthermore, the power supply line 33 is electrically connected to the cable 8, one end of which is connected to one side of the power supply device 2 for the electric discharge machine (for example, the positive side of the DC power supply of the power supply device 2 for an electric discharge machine). The power supply line 33 and the power supply base 35 are examples of conductive parts of the electric discharge machine.

The spindle device 32 is movable along the X, Y, and Z axes of the three-dimensional coordinate system by a servo motor (not illustrated) of the narrow-hole electric discharge machine 6. The guide arm 34 and the power supply base 35 are movable in the a direction or the b direction along the W axis, which is a movement axis parallel to the Z axis, relative to the spindle device 32, by the servo motor of the narrow-hole electric discharge machine 6.

The diagnostic device 1 comprises contacts 11, 12, a simulated current generation unit 13, an op-amp 14 as a voltage detection unit, a current detection unit 15, analog-digital converters (ADCs) 16, 17, arithmetic units 18, 19, and an NC device 20.

The contact 11 is attached to the power supply base 35 and is electrically connected to one side of the power supply device 2 for an electric discharge machine via the power supply line 33, the power supply base 35, and the cable 8.

The contact 12 is provided on the insulating part 22 and can be electrically connected to the other side of the power supply device 2 for an electric discharge machine (for example, the negative side of the DC power supply of the power supply device 2 for an electric discharge machine) via the conductive part 25. The conductive part 25 is an example of the conductive part of the table.

After the spindle device 32 moves along the X, Y, and Z axes directly above the stand 21, the contact 11 and the contact 12 are moved relative to each other by moving the contact 11 along the W axis together with the guide arm 34 and the power supply base 35 in the a direction or the b direction. As a result, the contact 12 can be connected to or separated from the contact 11.

The simulated current generation unit 13 is connected in series to the power supply device 2 for an electric discharge machine when the contacts 11, 12 are in the connected state. The simulated current generation unit 13 has a contactor switch 13$a$ and a resistor 13$b$. The contactor switch 13$a$ is connected in series to the resistor 13$b$. The contactor switch 13$a$ is an example of the switching element. The resistor 13$b$ is connected in series to the power supply device 2 for an electric discharge machine, and has a resistance value corresponding to the resistance value between the workpiece 5 and the pipe electrode 7 when dielectric breakdown of the discharge gap occurs.

In the present embodiment, the simulated current generation unit 13 generates a simulated current $I_{sim}$ based on the voltage applied by the power supply device 2 for an electric discharge machine to the simulated current generation unit 13 when the contact 11 and the contact 12 are in the connected state and the contactor switch 13$a$ is closed. The simulated current $I_{sim}$ is a current that simulates the current generated by dielectric breakdown of the discharge gap.

The voltage detection unit detects the voltage before and after the power supply device 2 for an electric discharge machine via the op-amp 14. The op-amp 14 is connected in parallel to the power supply device 2 for an electric discharge machine and has a non-inverting input and an inverting input, and an output unit connected to an input unit of the ADC 16.

In the present embodiment, the op-amp 14 as a voltage detection unit detects a simulated voltage $V_{sim}$ which simulates the voltage prior to dielectric breakdown of the discharge gap generated by the power supply device 2 for an electric discharge machine when the contact 11 and the contact 12 are in the connected state and the contactor switch 13$a$ is open. The op-amp 14 then outputs the detected simulated voltage $V_{sim}$ to the input unit of the ADC 16.

The current detection unit 15 has a shunt resistor 15*a* and a current sensing amplifier 15*b*. The shunt resistor 15*a* is connected between the conductive part 25 and the power supply device 2 for an electric discharge machine. The current sensing amplifier 15*b* amplifies the voltage across the shunt resistor 15*a* corresponding to the value of the current flowing into the resistor 13*b*, and outputs the amplified voltage to an input unit of the ADC 17.

In the present embodiment, the current detection unit 15 detects the voltage at both ends of the shunt resistor 15*a* corresponding to the value of simulated current $I_{sim}$ which simulates the current generated by dielectric breakdown of the discharge gap when the contact 11 and the contact 12 are in the connected state and the contactor switch 13*a* is closed. The current detection unit 15 outputs the detected voltage to the input unit of the ADC 17.

The ADC 16 performs analog-to-digital conversion of the simulated voltage $V_{sim}$ detected by the op-amp 14 as a voltage detection unit, and outputs the analog-to-digital converted simulated voltage $V_{sim}$ to the arithmetic unit 18. The ADC 17 performs analog-to-digital conversion of the voltage detected by the current detection unit 15, and outputs the analog-to-digital converted voltage to the arithmetic unit 19.

The arithmetic units 18, 19 are constituted by, for example, field programmable gate arrays (FPGAs). The arithmetic unit 18 calculates the peak voltage of the simulated voltage $V_{sim}$ and the rise time of the simulated voltage $V_{sim}$. The arithmetic unit 19 acquires the value of simulated current $I_{sim}$ by converting the value of the voltage output from the current sensing amplifier 15*b* into a current value based on a table representing the relationship between voltage and current stored in a storage unit (not illustrated) of the arithmetic unit 19.

The arithmetic unit 19 calculates the average current of the simulated current $I_{sim}$ and the on-time and off-time of the simulated current $I_{sim}$, and supplies data such as the average current of the simulated current $I_{sim}$ and the on-time and off-time of the simulated current $I_{sim}$ to the arithmetic unit 18. The arithmetic unit 18 supplies data such as the peak voltage of the simulated voltage $V_{sim}$, the rise time of the simulated voltage $V_{sim}$, the average current of the simulated current $I_{sim}$, and the on-time and off-time of the simulated current $I_{sim}$ to the NC device 20.

The NC device 20 reads and interprets an NC program in which the machining condition settings are described from the storage unit (not illustrated) of the NC device 20, and supplies the machining condition settings to the pulse generation circuit 9. Furthermore, the NC device 20 controls a servo motor for driving the spindle device 32 in the X-axis direction, the Y-axis direction, and the Z-axis direction, and a servo motor for driving the guide arm 34 and the power supply base 35 in the W-axis direction. Furthermore, the NC device 20 controls the opening or closing of the contactor switch 13*a*.

In the present embodiment. the NC device 20 judges the presence or absence of an abnormality of the power supply device 2 for an electric discharge machine based on data such as the peak voltage of the simulated voltage $V_{sim}$, the rise time of the simulated voltage $V_{sim}$, the average current of the simulated current $I_{sim}$, and the on-time and off-time of the simulated current $I_{sim}$. Specifically, the storage unit of the NC device 20 stores a computer program, which will be described later, for judging the presence or absence of an abnormality of the power supply device 2 for an electric discharge machine as described above. The NC device 20 may comprise a circuit for judging the presence or absence of an abnormality of the power supply device 2 for an electric discharge machine as described above. The combination of the op-amp 14 as a voltage detection unit, the current detection unit 15, the ADCs 16, 17, the arithmetic units 18, 19, and the NC device 20 is an example of a judgment unit.

Figure 2:
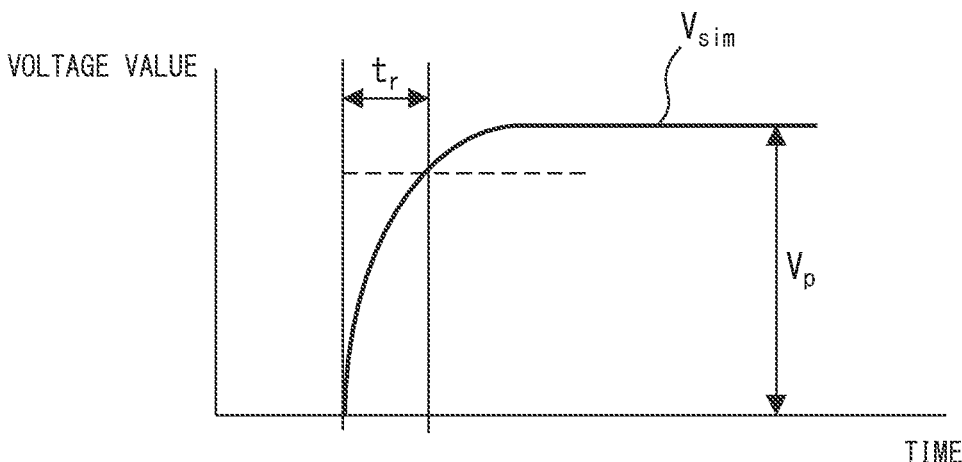
FIG. 2 is a view showing simulated voltage detected by the diagnostic device for a power supply device for an electric discharge machine of FIG. 1.

FIG. 2 is a view showing a simulated voltage detected by the diagnostic device for a power supply device for an electric discharge machine of FIG. 1. The NC device 20 judges whether the value of the peak voltage $V_P$ of the simulated voltage $V_{sim}$ is within a predetermined range. For example, the NC device 20 judges whether the value of peak voltage $V_P$ is 95% or more and 105% or less of a predetermined reference value of peak voltage. If the value of the peak voltage $V_P$ of the simulated voltage $V_{sim}$ is within the predetermined range, the NC device 20 judges that there are no abnormalities in the power supply device 2 for an electric discharge machine. Conversely, if the value of the peak voltage $V_P$ of the simulated voltage $V_{sim}$ is not within the predetermined range, the NC device 20 judges that there is an abnormality in the power supply device 2 for an electric discharge machine. The NC device 20 then stops the operation of the narrow-hole electric discharge machine 6, and displays an alarm indicating that there is an abnormality in the power supply device 2 for the electric discharge machine on a display unit (not illustrated) of the NC device 20. The display unit of the NC device 20 is constituted by, for example, a touch panel display.

Furthermore, the NC device 20 judges whether the rise time tr of the simulated voltage $V_{sim}$ is within a predetermined range. For example, the NC device 20 judges whether the rise time tr is 95% or more and 105% or less of a predetermined reference value of the rise time. If the rise time tr is within the predetermined range, the NC device 20 judges that there are no abnormalities in the power supply device 2 for an electric discharge machine. Conversely, if the rise time $t_r$ is not within the predetermined range, the NC device 20 judges that there is an abnormality in the power supply device 2 for the electric discharge machine. The NC device 20 the stops the operation of the narrow-hole electric discharge machine 6 and displays an alarm on the display unit of the NC device 20 indicating that there is an abnormality in the power supply device 2 for the electric discharge machine.

Figure 3:
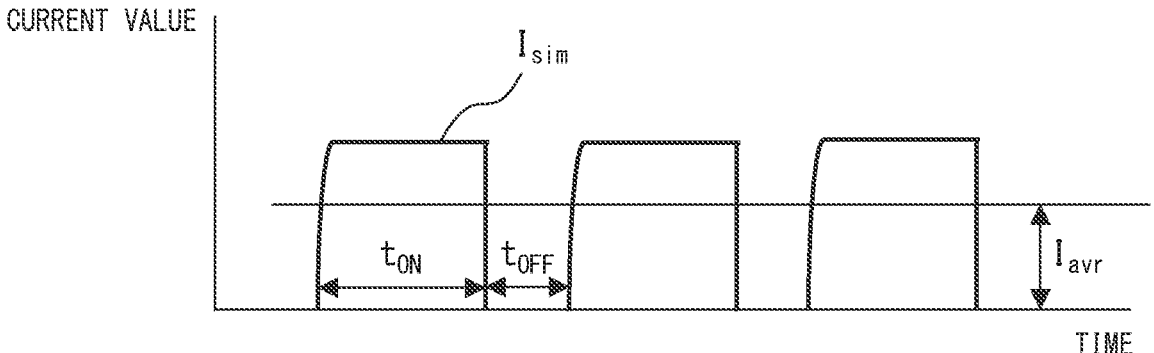
FIG. 3 is a view showing simulated current detected by the diagnostic device for a power supply device for an electric discharge machine of FIG. 1.

FIG. 3 is a view showing a simulated current detected by the diagnostic device for a power supply device for an electric discharge machine of FIG. 1. The NC device 20 judges whether the average current value $I_{AVR}$ of the simulated current $I_{sim}$ is within a predetermined range. For example, the NC device 20 judges whether the value $I_{AVR}$ of average current is 95% or more and 105% or less of a predetermined reference value of average current. If the average current value $I_{AVR}$ is within the predetermined range, the NC device 20 judges that there are no abnormalities in the power supply device 2 for the electric discharge machine. Conversely, if the average current value $I_{AVR}$ is not within the predetermined range, the NC device 20 judges that there is an abnormality in the power supply device 2 for the electric discharge machine. The NC device 20 then stops the operation of the narrow-hole electric discharge machine 6 and displays an alarm on the display unit of the NC device 20 indicating that there is an abnormality in the power supply device 2 for the electric discharge machine.

Furthermore, the NC device 20 judges whether both the on-time $t_{ON}$ and off-time $t_{OFF}$ of the simulated current $I_{sim}$ are within a predetermined range. For example, the NC device 20 judges whether the on-time $t_{ON}$ of the simulated current $I_{sim}$ is 95% or more and 105% or less of a prede-termined reference value of on-time, and the off-time $t_{OFF}$ of the simulated current $I_{sim}$ is 95% or more and 105% or less of a predetermined reference value of off-time. If both the on-time $t_{ON}$ and off-time $t_{OFF}$ of the simulated current $I_{sim}$ are within the predetermined range, the NC device 20 judges that there are no abnormalities in the power supply device 2 for the electric discharge machine. Conversely, if at least one of the on-time $t_{ON}$ and off-time $t_{OFF}$ of the simulated current $I_{sim}$ is not within the predetermined range, the NC device 20 judges that there is an abnormality in the power supply device 2 for the electric discharge machine. The NC device 20 then stops the operation of the narrow-hole electric discharge machine 6 and displays an alarm on the display unit of the NC device 20 indicating that there is an abnor-mality in the power supply device 2 for the electric discharge machine.

Figure 4:
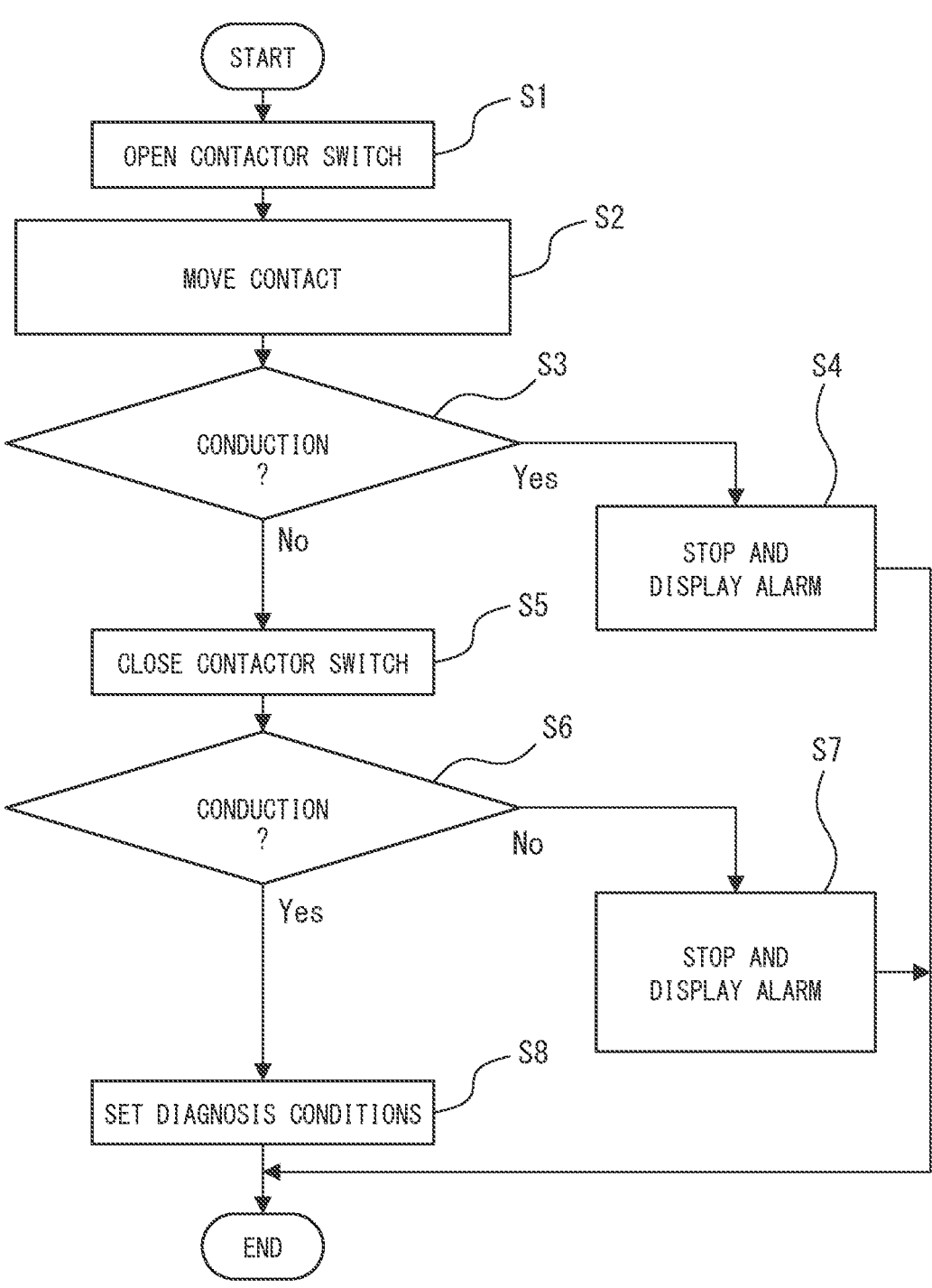
FIG. 4 is a flowchart detailing the operation of judging the presence or absence of a malfunction of a contactor switch and the presence or absence of a contact failure of contacts.

FIG. 4 is a flowchart detailing the operation of judging the presence or absence of a malfunction of the contactor switch and the presence or absence of a contact failure of the contacts. This flow is executed by the NC device 20 based on a computer program for judging the presence or absence of malfunction of the contactor switch and the presence or absence of contact failure of the contacts, which is stored in the storage unit of the NC device 20. Furthermore, this flow starts in a state in which the contacts 11, 12 are separated from each other before judging the presence or absence of an abnormality in the power supply device for an electric discharge machine based on the simulated voltage $V_{sim}$.

First, the NC device 20 opens the contactor switch 13a (step S1). Next, the NC device 20 moves the contact 11 so that the contact 11 is in contact with the contact 12 by moving the guide arm 34 and the power supply base 35 in the a direction along the W axis (step S2).

Next, the NC device 20 judges whether the path from one side of the power supply device 2 for an electric discharge machine to the other side is in a conductive state (step S3). The judgment regarding whether the path from one side of the power supply device 2 for an electric discharge machine to the other side is in a conductive state is performed based on, for example, the current based on the voltage applied to the simulated current generation unit 13 of the power supply device 2 for an electric discharge machine. Specifically, it is judged whether or not the value of current is 0 based on the voltage applied to the simulated current generation unit 13 of the power supply device 2 for an electric discharge machine. The voltage applied to the simulated current gen-eration unit 13 of the power supply device 2 for an electric discharge machine is generated when the pulse signal gen-erated by the pulse generation circuit 9 based on the instruc-tion of the NC device 20 is input to the power supply device 2 for an electric discharge machine.

If the path from one side of the power supply device 2 for an electric discharge machine to the other side is in a conductive state, i.e., if the current value based on the voltage applied to the simulated current generation unit 13 of the power supply device 2 for an electric discharge machine is not 0 (Yes in step S3), the NC device 20 judges that there is a malfunction of the contactor switch. The NC device 20 then stops the operation of the narrow-hole electric discharge machine 6 and displays an alarm indicat-ing that there is a malfunction of the contactor switch on the display unit of the NC device 20 (step S4). The NC device 20 then ends the process.

If the path from one side of the power supply device 2 for an electric discharge machine to the other side is not in a conductive state, i.e., if the current value based on the voltage applied to the simulated current generation unit 13 of the power supply device 2 for an electric discharge machine is 0 (NO in step S3), the NC device 20 closes the contactor switch 13a (step S5).

Next, the NC device 20 judges whether the path from one side of the power supply device 2 for an electric discharge machine to the other side is in a conductive state (step S6). The judgment performed in step S6 is the same as the judgment performed in step S3.

If the path from one side of the power supply device 2 for an electric discharge machine to the other side is not in a conductive state (No in step S6), i.e., if the current value based on the voltage applied to the simulated current gen-eration unit 13 of the power supply device 2 for an electric discharge machine is 0, the NC device 20 judges that there is a malfunction of the contactor switch or a contact failure of the contacts. The NC device 20 then stops the operation of the narrow-hole electric discharge machine 6 and displays an alarm indicating that there is a malfunction of the contactor switch or a contact failure on the display unit of the NC device 20 (step S7). After step S7, the NC device 20 ends the process.

If the path from one side of the power supply device 2 for an electric discharge machine to the other side is in a conductive state, i.e., if the current value based on the voltage applied to the simulated current generation unit 13 of the power supply device 2 for an electric discharge machine is not 0 (Yes in step S6), the NC device 20 sets the diagnostic conditions (step S8). The diagnostic conditions include the magnitude of the applied voltage and the mag-nitude of the supplied current of the power supply device 2 for an electric discharge machine, which are set in accor-dance with the type of the machining (finishing, rough machining, narrow-hole electric discharge machining, etc.) to be performed after diagnosing the presence or absence of an abnormality of the power supply device for the electric discharge machine. After step S8, the NC device 20 ends the process.

Figure 5:
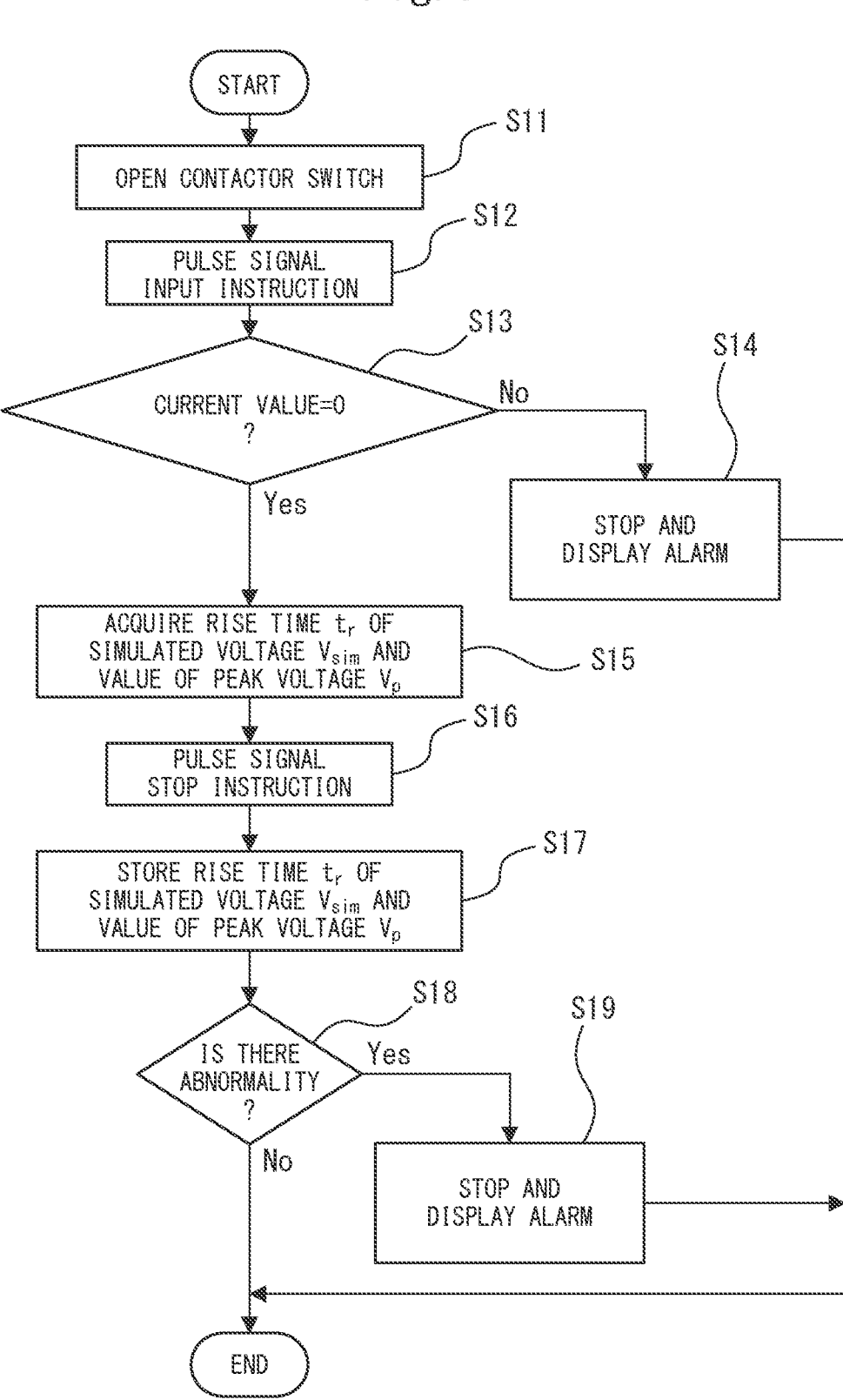
FIG. 5 is a flowchart detailing the operation of judging the presence or absence of an abnormality of a power supply device for an electric discharge machine based on the presence or absence of a malfunction of a contactor switch and a simulated voltage.

FIG. 5 is a flowchart detailing the operation of judging the presence or absence of a malfunction of a contactor switch and the presence or absence of an abnormality of a power supply device for an electric discharge machine based on a simulated voltage. This flow is executed by the NC device 20 based on a computer program for judging the presence or absence of malfunction of a contactor switch and the pres-ence or absence of abnormality of a power supply device for an electric discharge machine based on a simulated voltage. Furthermore, this flow starts in a state in which the contact 11 and the contact 12 are in contact with each other after the NC device 20 sets the diagnostic conditions.

First, the NC device 20 opens the contactor switch 13a (step S11). Next, the NC device 20 transmits, to the pulse generation circuit 9, an instruction (pulse signal input instruction) to input a pulse signal for generating the simu-lated voltage $V_{sim}$ based on the voltage applied to the simulated current generation unit 13 of the power supply device 2 for an electric discharge machine to the power supply device 2 for an electric discharge machine (step S12). The pulse signal input instruction transmitted in step S12 is set based on the diagnostic conditions.

Next, the NC device 20 judges whether the current value based on the voltage applied to the simulated current gen-eration unit 13 of the power supply device 2 for an electric discharge machine is 0 (step S13). If the current value based on the voltage applied to the simulated current generation unit 13 of the power supply device 2 for an electric discharge machine is not 0 (No in step S13), the NC device 20 judges that there is a malfunction of the contactor switch. The NC device 20 then stops the operation of the narrow-hole electric discharge machine 6 and displays an alarm indicating that there is a malfunction of the contactor switch on the display unit of the NC device 20 (step S14). After step S14, the NC device 20 ends the process.

If the current value based on the voltage applied to the simulated current generation unit 13 of the power supply device 2 for an electric discharge machine is 0 (Yes in step S13), the NC device 20 acquires the peak voltage $V_P$ and rise time $t_r$ of the simulated voltage $V_{sim}$ from the arithmetic unit 18 (step S15).

Next, the NC device 20 transmits, to the pulse generation circuit 9, an instruction (pulse signal stop instruction) to stop inputting the pulse signal to the power supply device 2 for an electric discharge machine for generating the simulated voltage $V_{sim}$ based on the voltage applied to the simulated current generation unit 13 of the power supply device 2 for an electric discharge machine (step S16). The pulse signal stop instruction transmitted in step S16 is set based on the diagnostic conditions. Next, the NC device 20 stores the peak voltage $V_P$ and rise time $t_r$ of the simulated voltage $V_{sim}$ in the storage unit of the NC device 20 (Step S17).

Next, the NC device 20 judges the presence or absence of an abnormality of the power supply device 2 for an electric discharge machine based on the peak voltage $V_P$ and rise time $t_r$ of the simulated voltage $V_{sim}$ (step S18). If there is an abnormality in the power supply device 2 for an electric discharge machine (Yes in step S18), the NC device 20 judges that there is an abnormality in the power supply device 2 for an electric discharge machine. The NC device 20 then stops the operation of the narrow-hole electric discharge machine 6 and displays an alarm indicating that there is an abnormality in the power supply device 2 for an electric discharge machine on the display unit of the NC device 20 (step S19). After step S19, the NC device 20 ends the process. If there are no abnormalities in the power supply device 2 for an electric discharge machine (No in step S18), the NC device 20 ends the process.

Figure 6:
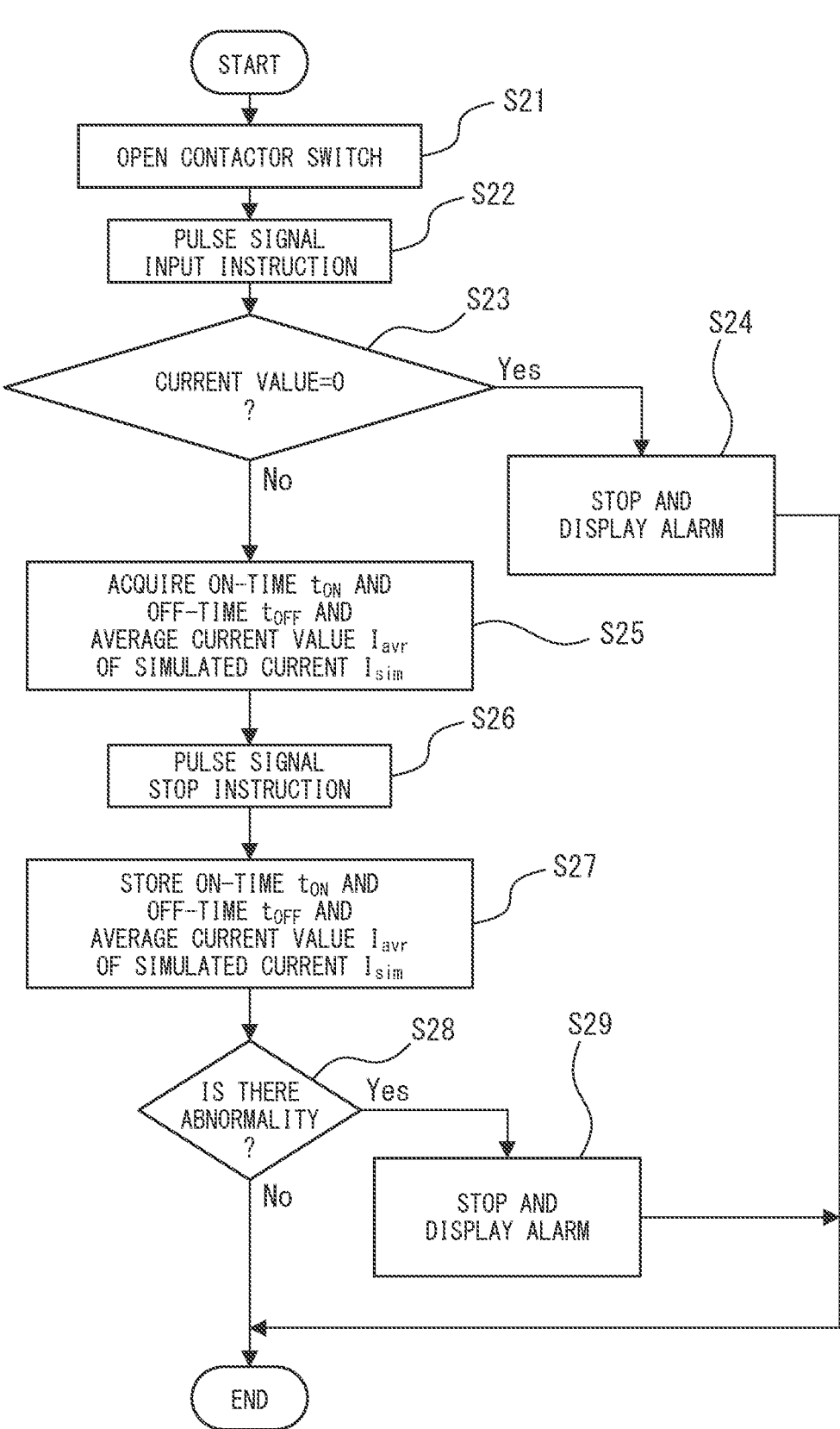
FIG. 6 is a flowchart detailing the operation of judging the presence or absence of an abnormality of a power supply device for an electric discharge machine based on the presence or absence of a malfunction of a contactor switch and simulated current.

FIG. 6 is a flowchart for detailing the operation of judging the presence or absence of a malfunction of a contactor switch and the presence or absence of an abnormality in a power supply device for an electric discharge machine based on a simulated current. This flow is executed by the NC device 20 based on a computer program for judging the presence or absence of a malfunction of a contactor switch and the presence or absence of an abnormality of a power supply device for an electric discharge machine based on a simulated current. Furthermore, this flow starts in a state in which the contact 11 and the contact 12 are in contact with each other after it has been determined that there are no abnormalities in the power supply device 2 for an electric discharge machine in step S18 of the flowchart of FIG. 5.

First, the NC device 20 closes the contactor switch 13*a* (step S21). Next, the NC device 20 transmits, to the pulse generation circuit 9, an instruction (pulse signal input instruction) to input a pulse signal for generating the simulated current $I_{sim}$ based on the voltage applied to the simulated current generation unit 13 of the power supply device 2 for an electric discharge machine to the power supply device 2 for the electric discharge machine (step S22). The pulse signal input instruction transmitted in step S22 is set based on diagnostic conditions.

Next, the NC device 20 judges whether the current value based on the voltage applied to the simulated current generation unit 13 of the power supply device 2 for an electric discharge machine is 0 (step S23). If the current value based on the voltage applied to the simulated current generation unit 13 of the power supply device 2 for an electric discharge machine is 0 (Yes in step S13), the NC device 20 judges that there is a malfunction of the contactor switch or a contact failure of the contacts. The NC device 20 the stops the operation of the narrow-hole electric discharge machine 6 and displays an alarm indicating that there is a malfunction of the contactor switch or a contact failure of the contacts on the display unit of the NC device 20 (step S24). After step S24, the NC device 20 ends the process.

If the current value based on the voltage applied to the simulated current generation unit 13 of the power supply device 2 for an electric discharge machine is not 0 (No in step S23), the NC device 20 acquires the on-time $t_{ON}$ and off-time $t_{OFF}$ of the simulated current $I_{sim}$ and the average current value $I_{AVR}$ from the arithmetic unit 18 (step S25).

Next, the NC device 20 transmits, to the pulse generation circuit 9, an instruction (pulse signal stop instruction) to stop inputting the pulse signal to the power supply device 2 for the electric discharge machine for generating the simulated current $I_{sim}$ based on the voltage applied to the simulated current generation unit 13 of the power supply device 2 for an electric discharge machine (step S26). The pulse signal stop instruction transmitted in step S26 is set based on the diagnostic conditions. After step S26, the NC device 20 stores the on-time $t_{ON}$ and off-time $t_{OFF}$ and the average current value $I_{AVR}$ of the simulated current $I_{sim}$ in the storage unit of the NC device 20 (step S27).

Next, the NC device 20 judges the presence or absence of an abnormality of the power supply device 2 for the electric discharge machine based on the average current value $I_{AVR}$ and the on-time $t_{ON}$ and off-time $t_{OFF}$ of the simulated current $I_{sim}$ (step S28). If there is an abnormality in the power supply device 2 for an electric discharge machine (Yes in step S28), the NC device 20 judges that there is an abnormality in the power supply device 2 for the electric discharge machine. The NC device 20 then stops the operation of the narrow-hole electric discharge machine 6 and displays an alarm indicating that there is an abnormality in the power supply device 2 for the electric discharge machine on the display unit of the NC device 20 (step S29). After step S29, the NC device 20 ends the process. If there are no abnormalities in the power supply device 2 for an electric discharge machine (No in step S28), the NC device 20 ends the process. If it is judged in step S28 of the flowchart of FIG. 6 that there are no abnormalities in the power supply device 2 for an electric discharge machine, electric discharge machining of the workpiece 5 by the narrow-hole electric discharge machine 6 can be started.

According to the present embodiment, the simulated current generation unit 13 generates a simulated current $I_{sim}$ for simulating a current generated by dielectric breakdown of the discharge gap in a state in which the contact 11 and the contact 12 are in contact with each other based on the voltage applied to the power supply device 2 for the electric discharge machine. The NC device 20 then judges the presence or absence of an abnormality of the power supply device 2 for an electric discharge machine based on the simulated current $I_{sim}$. Since the presence or absence of an abnormality in the power supply device 2 for electric discharge machine is judged based on the simulated current $I_{sim}$ for simulating the current generated by dielectric breakdown of the discharge gap, the presence or absence of an abnormality of the power supply device 2 for the electric discharge machine can be diagnosed before electrical discharge machining of the workpiece 5 by the narrow-hole electric discharge machine 6.

Furthermore, according to the present embodiment, by diagnosing the presence or absence of an abnormality of the power supply device 2 for an electric discharge machine before electrical discharge machining of the workpiece 5 by the narrow-hole electric discharge machine 6, if there is an abnormality in the power supply device 2 for the electric discharge machine power, it is possible to repair the malfunctioning part of the power supply device 2 for the electric discharge machine, replace the power supply device for the electric discharge machine, etc. Since the power supply device 2 for the electric discharge machine can be made normal by repairing the malfunctioning part of the power supply device 2 for the electric discharge machine, replacing the power supply device for the electric discharge machine, etc., it is possible to avoid producing defective products by electrical discharge machining of the workpiece 5 by the narrow-hole electric discharge machine 6 using the power supply device 2 for the electric discharge machine having an abnormality.

Furthermore, according to the present embodiment, it is possible to avoid producing defective products by electrical discharge machining of the workpiece 5 by the narrow-hole electric discharge machine (using the power supply device 2 for the electric discharge machine having an abnormality. Thus, it is not necessary to stop machining of the workpiece 5 for inspection or dispose of defective products when a defective product occurs due to electric discharge machining of the workpiece 5 by the narrow-hole electric discharge machine 6 using the power supply device 2 for the electric discharge machine having an abnormality. Furthermore, it is possible to avoid consumption of the pipe electrode 7 when a defective product is produced by electrical discharge machining of the workpiece 5 by the narrow-hole electric discharge machine 6 using the power supply device 2 for the electric discharge machine having an abnormality.

Furthermore, according to the present embodiment, the presence or absence of an abnormality in the power supply device 2 for the electric discharge machine is judged based on the average current value $I_{AVR}$ and the on-time $t_{ON}$, and off-time $t_{OFF}$ of the simulated current $I_{sim}$. As a result, the presence or absence of an abnormality of the power supply device 2 for the electric discharge machine can be accurately diagnosed before electrical discharge machining of the workpiece 5 by the narrow-hole electric discharge machine 6.

Furthermore, according to the present embodiment, by judging the presence or absence of an abnormality of the power supply device for the electric discharge machine based on the simulated voltage $V_{sim}$, the presence or absence of an abnormality of the power supply device for the electric discharge machine can be diagnosed prior to generating the simulated current $I_{sim}$.

Furthermore, according to the present embodiment, by judging the presence or absence of an abnormality of the power supply device for an electric discharge machine based on the peak voltage $V_P$ and the rise time $t_r$ of the simulated voltage $V_{sim}$, it is possible to accurately diagnose the presence or absence of an abnormality of the power supply device for the electric discharge machine before generating the simulated current $I_{sim}$.

Furthermore, according to the present embodiment, by using the resistor 13b having a resistance value corresponding to the resistance value of the discharge gap when dielectric breakdown occurs, the simulated current $I_{sim}$ can accurately simulate the current caused by dielectric breakdown of the discharge gap.

Furthermore, according to the present embodiment, by using the contactor switch 13a, which is open when generating the simulated voltage $V_{sim}$ and closed when generating the simulated current $I_{sim}$, the simulated voltage $V_{sim}$ and the simulated current $I_{sim}$ can be quickly generated.

Furthermore, according to the present embodiment, by using the contactor switch 13a, it is possible to reduce variations in judgment of the presence or absence of an abnormality of the power supply device 2 for an electric discharge machine.

Furthermore, according to the present embodiment, by judging the presence or absence of contact failure between the first contact and the second contact, if there is contact failure between the first contact and the second contact, it is possible to repair the contact failure between the first contact and the second contact.

Furthermore, according to the present embodiment, by judging the presence or absence of a malfunction of the contactor switch 13a, if there is a malfunction of the contactor switch 13a, it is possible to replace the contactor switch 13a.

The present invention is not limited to the embodiments described above, and numerous changes and modifications can be made. For example, the conductive part 25 may be provided at any position on the table 4. Furthermore, in order to enable the contact 11 and the contact 12 to be connected or separated, the stand 21 on which the contact 12 is provided via the insulating part 22 may be made movable in the a direction or the b direction, whereby the contact 11 and the contact 12 can be moved relative to each other. In this case, the contact 1 1 may be provided on a conductive part which is affixed to the narrow-hole electric discharge machine 6 and which allows the cable 8 to be electrically connected to one side of the power supply device 2 for the electric discharge machine.

Furthermore, the simulated current generation unit 13 may be arranged at any position along the path from one side of the power supply device 2 for an electric discharge machine to the other side. Furthermore, a switching element (for example, an NMOS transistor) other than the contactor switch 13a may be used. Alternatively, the contactor switch 13a may be omitted, and the switching operation performed by the contactor switch 13a may be performed by connecting or separating the contact 11 and the contact 12.

Furthermore, the presence or absence of an abnormality of the power supply device 2 for an electric discharge machine may be judged based on at least one of the peak voltage of the simulated voltage $V_{sim}$, the rise time of the simulated voltage $V_{sim}$, the average current of the simulated current $I_{sim}$, and the on-time and off-time of the simulated current $I_{sim}$. Furthermore, the presence or absence of an abnormality of a frequency, etc., of the power supply device 2 for an electric discharge machine may be judged by detecting other factors that can determine abnormalities such as peak current. current distribution, average voltage, voltage distribution, duty factor, frequency, etc. Furthermore, the presence or absence of an abnormality of the power supply device 2 for an electric discharge machine may be judged by a device other than the NC device 20 (for example, the arithmetic unit 18).

Further, the presence or absence of an abnormality of the power supply device 2 for an electric discharge machine may be judged in a state in which there is no electrical discharge machining fluid in the work tank 3. Furthermore, the presence or absence of an abnormality of the power supply device 2 for an electric discharge machine may be judged in a state in which at least one of the workpiece 5 and the pipe electrode 7 is absent. Further, the presence or absence of a malfunction of the contactor switch 13*a* or the presence or absence of a contact failure of the contacts 11, 12 may be judged at any time before machining the workpiece 5.

Figure 7:
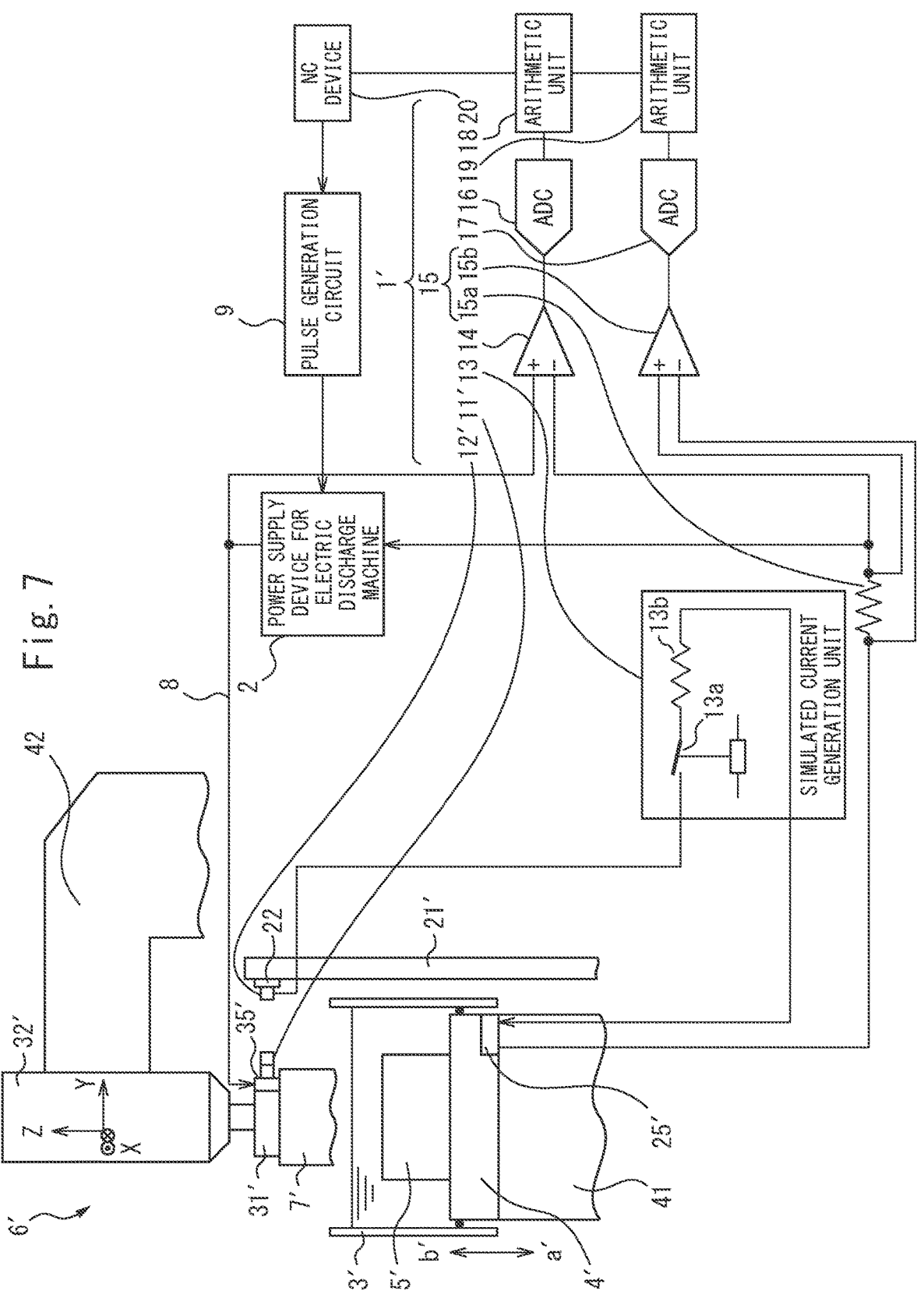
FIG. 7 is a view showing a system comprising a diagnostic device for a power supply device for an electric discharge machine according to another embodiment of the present invention.

The present invention may be applied not only to the narrow-hole electric discharge machine 6 of the embodiments described above, but also to other electric discharge machines. For example, the present invention may be applied to a die-sinking electric discharge machine. An example is shown in FIG. 7. In FIG. 7, the diagnostic device 1' comprises contacts 11', 12', the simulated current generation unit 13, the op-amp 14 as a voltage detection unit, the current detection unit 15, the analog-to-digital converters (ADCs) 16, 17, the arithmetic units 18, 19 and the NC device 20. A table 4' is affixed to the top surface of a bed 41, and a workpiece S' is attached to the top surface of the table 4'. The periphery of the table 4' is surrounded by a work tank 3' which can be raised and lowered in the a' direction or the b' direction, and during machining of a workpiece by the die-sinking electric discharge machine 6', the work tank 3' is raised and electrical discharge machining fluid is supplied. An XY slider 42 which is movable in the X-axis direction and the Y-axis direction is provided on the bed 41, and a spindle device 32' which is movable in the Z-axis direction is provided on the tip of the XY slider 42. An electrode 7' is attached to the lower end of the spindle device 32' via an electrode holder 31'. Machining discharge by the die-sinking electric discharge machine 6' is performed by connecting one side of the power supply device 2 for an electric discharge machine to a power supply base 35' of the electrode holder 31', connecting the other side of the power supply device 2 for an electric discharge machine to a conductive part 25' of the table 4', applying a pulse voltage to the discharge gap, and moving the workpiece S' and the electrode 7' relative to each other in the electrical discharge fluid.

The contacts 11', 12' of the embodiment shown in FIG. 7, which correspond to the contacts 11, 12 of the embodiment shown in FIG. 1, are affixed to the electrode holder 31' and the upper part of the stand 21' standing on the bed 41', respectively. The contact 12' is affixed to the stand 21' via the insulating part 22'. The contact 11' is in conduction with one side of the power supply device 2 for an electric discharge machine via the power supply base 35'. The contact 12' is in conduction with the conductive part 25' of the table 4' via the simulated current generation unit 13, and is ultimately in conduction with the other side of the power supply device 2 for an electric discharge machine.

Before the work tank 3' is raised and the electrical discharge machining fluid is supplied, which is the pre-stage of electrical discharge machining by the die-sinking electric discharge machine 6', the contacts 11', 12' are connected by moving the relative positions of the contacts 11', 12' along the X-axis, Y-axis, and Z-axis, and the power supply device 2 for an electric discharge machine can be diagnosed in the same manner as described for the embodiment shown in FIG. 1. Furthermore, the presence or absence of a malfunction of the contactor switch 13*a* of the simulated current generation unit 13 and the presence or absence of a contact failure of the contacts 11', 12' can be judged in the same manner as described for the embodiment shown in FIG. 1. Since the descriptions of the structures and modes of operations of the simulated current generation unit 13, the op-amp 14, the shunt resistor 15*a*, the current sensing amplifier 15*b*, the ADCs 16, 17, the arithmetic units 18, 19, the NC device 20, the pulse generation circuit 9, and the power supply device 2 for an electric discharge machine are the same as those described for the embodiment shown in FIG. 1, they have been omitted.

DESCRIPTION OF REFERENCE SIGNS

1,1' diagnostic device
2 power supply device for electric discharge machine
3,3' work tank
4, 4' table
5,5' workpiece
6 narrow-hole electric discharge machine
6' die-sinking electric discharge machine
7 pipe electrode
7' electrode
9 pulse generation circuit
11, 12, 11', 12' contact
13 simulated current generation unit
14 op-amp
15 current detection unit
18, 19 arithmetic unit
20 NC device
25 conductive part
31,31' electrode holder
32, 42' spindle device
35, 35' power supply base

The invention claimed is:

1. A diagnostic device for a power supply device for an electric discharge machine which applies a pulsed voltage to a discharge gap constituted by a workpiece and an electrode which face each other with a predetermined gap in order to perform electrical discharge machining on the workpiece with the electric discharge machine, the diagnostic device comprising:

a first contact which is capable of establishing conduction with one side of the power supply device for the electric discharge machine via a conductive part of the electric discharge machine, a second contact which is capable of establishing conduction with the other side of the power supply device for the electric discharge machine via a conductive part of a table on which the workpiece is arranged, and which can be brought into contact with or separated from the first contact, a simulated current generation unit which is connected in series to the power supply device for the electric discharge machine in a state in which the first contact and the second contact are in contact with each other and which generates a simulated current for simulating current caused by dielectric breakdown of the discharge gap based on the applied pulsed voltage of the power supply device for the electric discharge machine, and a judgment unit which detects the simulated current and judges presence or absence of an abnormality in the power supply device for the electric discharge machine based on the simulated current.

2. The diagnostic device for the power supply device for the electric discharge machine according to claim 1, wherein the judgment unit judges the presence or absence of the abnormality of the power supply device for the electric discharge machine based on at least one of an average current of the simulated current and an on-time and off-time of the simulated current.

3. The diagnostic device for the power supply device for electric discharge machine according to claim 1, wherein the judgment unit, prior to generating the simulated current, detects a simulated voltage which simulates voltage before dielectric breakdown of the discharge gap generated by the power supply device for electric discharge machine in the state in which the first contact and the second contact are in contact or in a state in which the first contact and the second contact are not in contact, and judges the presence or absence of abnormality of the power supply device for the electric discharge machine based on the simulated voltage.

4. The diagnostic device for the power supply device for the electric discharge machine according to claim 3, wherein the judgment unit judges the presence or absence of the abnormality of the power supply device for the electric discharge machine based on at least one of a peak voltage of the simulated voltage and a rise time of the simulated voltage.

5. The diagnostic device for the power supply device for electric discharge machine according to claim 3, wherein the simulated current generation unit comprises a resistor which is connected in series to the power supply device for the electric discharge machine, and the resistor has a resistance value corresponding to a resistance value of the discharge gap when the dielectric breakdown occurs.

6. The diagnostic device for the power supply device for the electric discharge machine according to claim 5, wherein the simulated current generation unit further comprises a switching element which is connected in series to the resistor, and the switching element is opened by a normally closed (NC) device of the electric discharge machine during generation of the simulated voltage, and closed by the NC device of the electric discharge machine during generation of the simulated current.

7. The diagnostic device for the power supply device for the electric discharge machine according to claim 6, wherein the switching element is a contactor switch.

8. The diagnostic device for the power supply device for the electric discharge machine according to claim 6, wherein the judgment unit judges the presence or absence of a malfunction of the switching element.

9. The diagnostic device for the power supply device for the electric discharge machine according to claim 1, wherein the judgment unit judges the presence or absence of a contact failure between the first contact and the second contact.

* * * * *